US012618871B2

(12) United States Patent
Leveugle

(10) Patent No.: US 12,618,871 B2
(45) Date of Patent: May 5, 2026

(54) APPARATUSES AND METHODS FOR ELECTROCHEMICAL IMPEDANCE SPECTROSCOPY MEASUREMENTS

(71) Applicant: Analog Devices International Unlimited Company, Limerick (IE)

(72) Inventor: Claire Leveugle, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 208 days.

(21) Appl. No.: 18/194,495

(22) Filed: Mar. 31, 2023

(65) Prior Publication Data

US 2024/0329084 A1 Oct. 3, 2024

(51) Int. Cl.
*G01R 1/073* (2006.01)
*G01R 31/3842* (2019.01)
*H01M 50/51* (2021.01)

(52) U.S. Cl.
CPC ......... *G01R 1/073* (2013.01); *G01R 31/3842* (2019.01); *H01M 50/51* (2021.01)

(58) Field of Classification Search
CPC ............... G01R 1/073; G01R 31/3842; G01R 19/16542; G01R 31/396; H01M 50/51
USPC ......................................... 324/426, 430–435
See application file for complete search history.

(56) References Cited

U.S. PATENT DOCUMENTS

2013/0234671 A1* 9/2013 Choi ..................... H02J 7/0016
                                                        320/128
2014/0375276 A1* 12/2014 Zeier ..................... H01M 10/06
                                                        320/145

2016/0329615 A1 11/2016 Bergmann et al.
2019/0170829 A1* 6/2019 Srinivasan ......... G01R 31/3648
2021/0223327 A1* 7/2021 Berger ................. G01R 31/396
2021/0234142 A1* 7/2021 Yoshikawa ......... H01M 50/502

FOREIGN PATENT DOCUMENTS

JP        2010193589 A  *  9/2010  .......... H01M 10/425
KR    20170123889 A  *  11/2017  .......... H01M 10/425
NZ           526091 A       4/2004

OTHER PUBLICATIONS

Machine translation of JP2010193589A (Year: 2010).*
Machine translation of KR20170123889A (Year: 2017).*
International Search Report and Written Opinion issued in corresponding International Application No. PCT/EP2024/054269 dated May 28, 2024.

* cited by examiner

*Primary Examiner* — Lee E Rodak
*Assistant Examiner* — Sangkyung Lee
(74) *Attorney, Agent, or Firm* — ArentFox Schiff LLP

(57) ABSTRACT

Aspects of the present disclosure include a battery measurement system having a plurality of capacitors, a plurality of probes each electrically coupled with a corresponding capacitor of the plurality of capacitors and a corresponding battery of a plurality of batteries, a controller configured to measure, via the plurality of probes, a plurality of voltages associated with the plurality of batteries in response to an interrogatory current, and a plurality of sense cables each associated with the corresponding battery of the plurality of batteries, wherein each sense cable of the plurality of sense cables is disposed across the corresponding battery such that the interrogatory current flows in a conduction channel in the corresponding battery in a first direction and in the corresponding cable in a second direction substantially opposite of the first direction.

18 Claims, 8 Drawing Sheets

APPARATUSES AND METHODS FOR ELECTROCHEMICAL IMPEDANCE SPECTROSCOPY MEASUREMENTS

BACKGROUND

In many applications, such as automotive, batteries may be used to provide electrical power. Applications using the batteries may include electrical vehicles, energy storage systems, etc. A battery system may include multiple batteries and/or battery cells (or clusters of multiple cells). It may be important to routinely check and/or measure the health of the battery cells, such as battery capacity, state of charge, aging, and other parameters. However, various factors may contribute to the errors of the measurements. Therefore, improvements are desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure include a battery measurement system having a plurality of capacitors, a plurality of probes each electrically coupled with a corresponding capacitor of the plurality of capacitors and a corresponding battery of a plurality of batteries, a controller configured to measure, via the plurality of probes, a plurality of voltages associated with the plurality of batteries in response to an interrogatory current, and a plurality of sense cables each associated with the corresponding battery of the plurality of batteries, wherein each sense cable of the plurality of sense cables is disposed across the corresponding battery such that the interrogatory current flows in a conduction channel in the corresponding battery in a first direction and in the corresponding cable in a second direction substantially opposite of the first direction.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which:

FIG. 2 illustrates an example of an implementation of the system for measuring the impedance of battery cells according to some aspects of the present disclosure.

DETAILED DESCRIPTION

Figure 1:
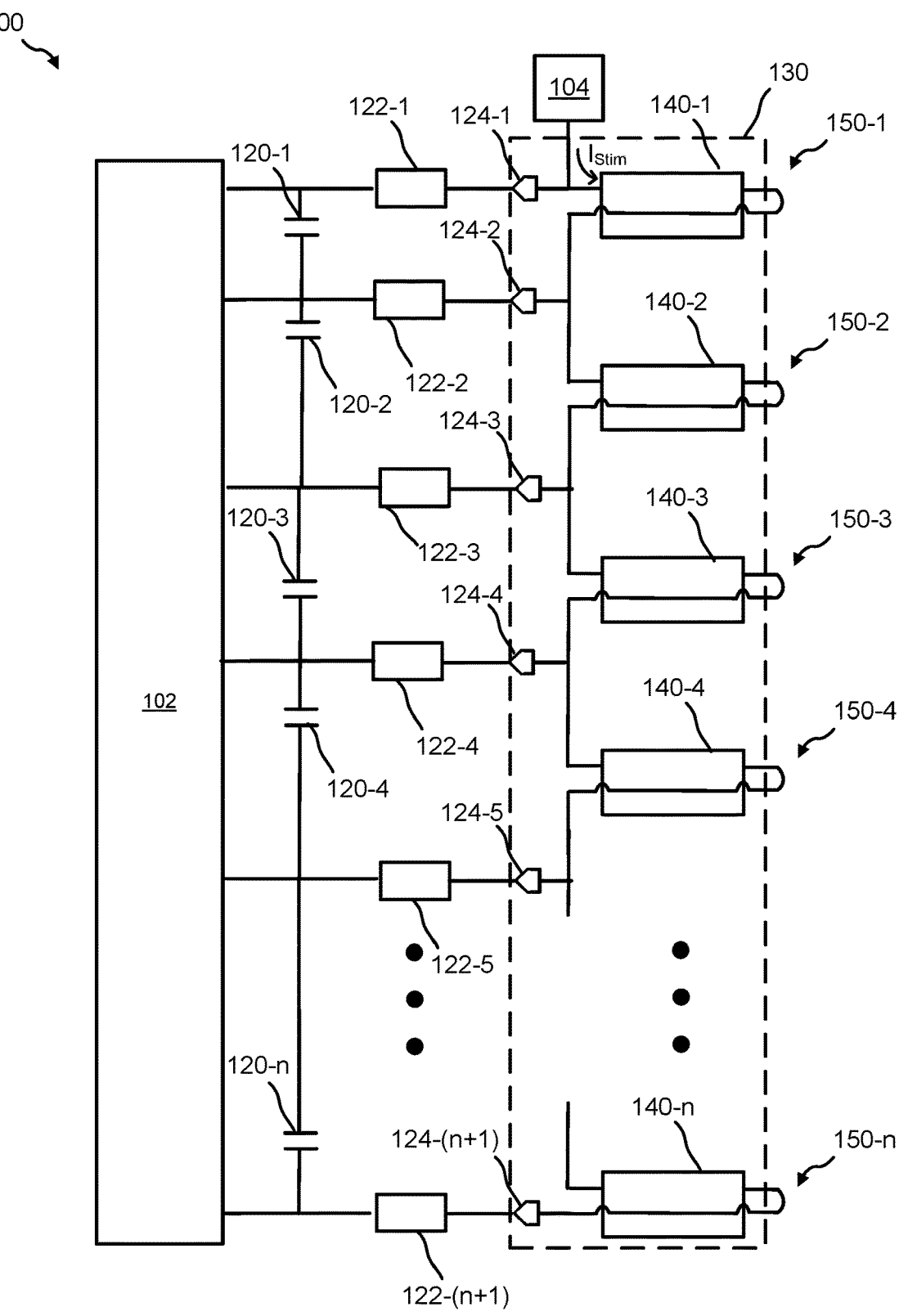
FIG. 1 illustrates an example of a system for measuring the impedance of battery cells according to some aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Electrochemical Impedance Spectroscopy (EIS) is a scheme to detect variations of the impedance (i.e., resistance and/or reactance) of a battery cell as a function of frequency. A interrogatory current may be supplied by an external source and/or the battery cell. A voltage is measured in response to the current being applied to a load. The impedance may be calculated based on the current and the voltage using Ohm's Law. The current may be applied at a particular frequency. As a result, the impedance may be calculated for the particular frequency.

Based on the impedance, certain information may be extracted such as temperature, state of charge, and/or state of health of the battery. The information may be used for diagnostics, improving performance, and/or design of the battery system. If any defective battery cell is detected during the diagnostic process, the defective battery cell, or the entire battery module, may be replaced. In one aspect, the EIS may be enabled by precisely synchronizing the voltage and/or the current reading of the battery cell at particular stimulus frequencies (e.g., between 100 millihertz (mHz) to 10 kilohertz (kHz), or 0.5 hertz and 20 kilohertz, or other frequencies and/or frequency ranges).

EIS multi-cell sensing allows to null the effect of the field created by the force harness on the sensing harness and other sources. The idea is to measure EIS on two adjacent cells whose respective wiring penetrates the force current loop in one direction then returns through the loop in the other direction. EIS can be used to harvest battery cell information. This is an area of interest in the automotive industry. At integrated circuit (IC) level and the cell level, this technique is very powerful. However, at the module level or the pack level, the cabling causes issue and the signal from the EIS may be degraded. Cabling at the cell level may also degrade the EIS signal.

An aspect of the present disclosure includes a multi-cell module (e.g., 8 cell module) being measured according to the techniques described below. In some instances, current loops may be created at the split between the cables of the input and output interrogating current. Twisting the cables, and/or using ribbon cables may reduce interference, but current loops cannot be avoided. Aspects of the present disclosure include arranging sense wires into two current loops with the effect (e.g., electro-magnetic interference) of the first current loop cancelling out the effect of the second loop. This may be performed without changing the internal wiring of the battery cells.

Another aspect of the present disclosure includes sampling two cells at a time (cells that have a sense in and a sense out of the current loops) to cancel out the effect of the magnetic (H) field (i.e., part of the electromagnetic interference) created by the current loops.

Certain aspects of the present disclosure include protecting against current loops created by high-voltage bars in the pack for the battery cells. EIS multi-cell measurement may be implemented to cancel out the effect of current loops created by cables on EIS impedance measurement. The measurement may include measuring at least 2 cells at a time then inferring the results of each of the single cells.

FIG. 1 illustrates an example of a system 100 for measuring EIS of a battery pack 130. The system 100 may include a controller 102 configured to acquire and/or analyze signals measured during an EIS measurement. The system 100 may optionally include a current source 104 configured to provide one or more EIS interrogatory currents $I_{Stim}$ (also referred to as the interrogatory currents). The current source 104 may be configured to provide the one or more EIS interrogatory currents $I_{Stim}$ at one or more frequencies.

The system 100 may include capacitors 120-1, 120-2 . . . 120-$n$ disposed between probes 122-1, 122-2 . . . 122-($n$+1) for measuring voltages and/or currents. The capacitors 120-1, 120-2 . . . 120-$n$ may be parasitic capacitors that result from the wires connecting the probes 122-1, 122-2 . . . 122-($n$+1) to the controller 102, and/or non-parasitic capacitors. The system 100 may include the probes 122-1, 122-2 . . . 122-($n$+1) configured to contact pins 124-1, 124-2 . . . 124-($n$+1) to conduct the EIS measurement.

Still referring to FIG. 1, the battery pack 130 may include the pins 124-1, 124-2 . . . 124-($n$+1) configured to provide electrical contacts to battery cells 140-1, 140-2 . . . 140-$n$. The battery pack 130 may include the battery cells 140-1, 140-2 . . . 140-$n$. In one aspect of the present disclosure, the battery pack 130 may include sense cables 150-1, 150-2 . . . 150-$n$ associated with the battery cells 140-1, 140-2 . . . 140-$n$.

In one aspect of the present disclosure, each of the sense cables 150-1, 150-2 . . . 150-$n$ may be disposed across the corresponding battery cell of the battery cells 140-1, 140-2 . . . 140-$n$ such that the one or more interrogatory currents $I_{Stim}$ flow in the corresponding battery in a first direction and in the corresponding cable in a second direction substantially opposite of the first direction. For example, the sense cable 150-1 may be placed across the battery cell 140-1 such that the one or more interrogatory currents $I_{Stim}$ may flow into the battery cell 140-1 in a first direction and out of the battery cell, via the sense cable 150-1, in a second diction opposite the first direction.

During operation, in certain implementations, the current source 104 may provide the one or more interrogatory currents $I_{Stim}$ at one or more frequencies through the battery pack 130, and specifically, sequentially through each of the battery cells 140-1, 140-2 . . . 140-$n$. The one or more interrogatory currents $I_{Stim}$ may be forced through the battery cells 140-1, 140-2 . . . 140-$n$ serially. In other words, the battery cells 140-1, 140-2 . . . 140-$n$ may be connected in series.

In some aspects, as the one or more interrogatory currents $I_{Stim}$ flow through the battery cells 140-1, 140-2 . . . 140-$n$, voltages may be developed on the contact pins 124-1, 124-2 . . . 124-($n$+1) due to the one or more interrogatory currents $I_{Stim}$ and the impedances of the battery cells 140-1, 140-2 . . . 140-$n$. The controller 102 may measure the voltages on the contact pins 124-1, 124-2 . . . 124-($n$+1). After measuring the voltages, the controller 102 may calculate the impedances of the battery cells 140-1, 140-2 . . . 140-$n$ based on the one or more interrogatory currents $I_{Stim}$ and the voltages measured at the contact pins 124-1, 124-2 . . . 124-($n$+1). The impedances may be a function of the frequency of the $I_{Stim}$, the current level of the $I_{Stim}$, temperature, aging, and/or other parameters. By determining the impedances, the controller 102 (or an external device, not shown) may be able to diagnose the temperature, aging, status of charge, health, and/or other characteristics of the battery cells 140-1, 140-2 . . . 140-$n$.

In some instances, the one or more interrogatory currents $I_{Stim}$ flowing through the battery cells 140-1, 140-2 . . . 140-$n$, or other parts of the battery pack 130 (e.g., such as the high voltage lines not shown), may generate electromagnetic interference. The generated electromagnetic interference may interfere with the data acquisition of the controller 102. For example, the electromagnetic interference may skew the impedance behaviors (shown as Nyquist diagrams) associated with the impedances of the battery cells 140-1, 140-2 . . . 140-$n$. The electromagnetic interference may introduce noise, and/or alter the impedances of the battery cells 140-1, 140-2 . . . 140-$n$ under the application of the one or more interrogatory currents $I_{Stim}$.

In certain aspects of the present disclosure, the sense cables 150-1, 150-2 . . . 150-$n$ may be disposed as such to reduce and/or eliminate the electromagnetic interference. In one implementation, the sense cables 150-1, 150-2 . . . 150-$n$ may be disposed to create a current loop that "counters" the current loop in the battery cells 140-1, 140-2 . . . 140-$n$. As such, the electromagnetic interference caused by the current flowing through a battery cell may be reduced and/or eliminated by the electromagnetic field caused by the current flowing through a corresponding sense cable.

In another implementation, the electromagnetic interference caused by the current flowing through a battery cell may be reduced and/or eliminated by the electromagnetic field caused by the current flowing through a neighbor battery cell.

In one example, the controller 102 may supply an interrogatory current $I_{Stim}$ through the battery cells 140-1, 140-2 . . . 140-$n$ connected in series. The interrogatory current $I_{Stim}$ may be an alternating current (AC) current. The interrogatory current $I_{Stim}$ may have a frequency of $f_{Stim}$. In response to the interrogatory current $I_{Stim}$, voltages may be developed on the contact pins 124-1, 124-2 . . . 124-($n$+1). The controller 102 may measure voltages on the contact pins 124-1, 124-2 . . . 124-($n$+1) via the probes 122-1, 122-2 . . . 122-($n$+1). For example, the controller 102 may measure the voltage developed across the battery 140-1 via the probes 122-1 and 122-2 and the contact pins 124-1 and 124-2. Based on the measured voltages, the controller 102 may be able to diagnose the temperature, aging, status of charge, health, and/or other characteristics of the battery cells 140-1, 140-2 . . . 140-$n$. The sense cables 150-1, 150-2 . . . 150-$n$ may be disposed as such to reduce and/or eliminate the electromagnetic interference. For example, the sense cable 150-1 may be disposed such that the interrogatory current $I_{Stim}$ flowing through the battery cell 140-1 in one direction and through the sense cable 150-1 in the opposing direction.

Figure 2:
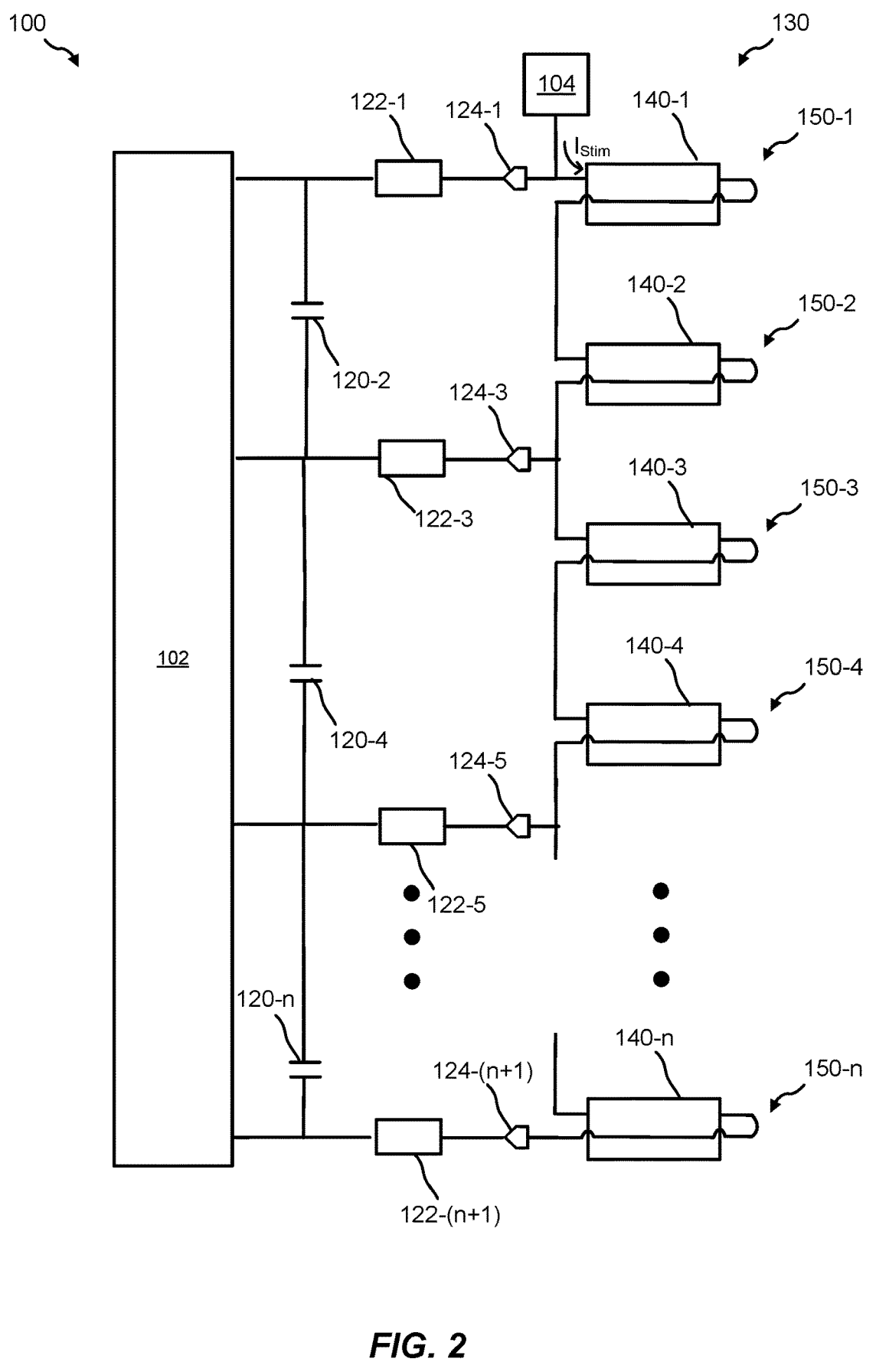

FIG. 2 illustrates an example of a schematic for operating the system 100. Referring to FIGS. 1 and 2, an aspect of the present disclosure includes measuring two battery cells at the same time. By measuring two battery cells at the same time, the electromagnetic interference from the one or more interrogatory currents $I_{Stim}$, high voltage lines, charging ports, operator interference, etc., may be identified, reduced, and/or eliminated. In one aspect, when measuring two battery cells at the same time, noise signals from the electromagnetic interference may appear identical on the impedance measurements of both battery cells. Consequently, the controller 102 may use software and/or hardware to remove the noise signals. In another aspect, when measuring two battery cells at the same time, the noise signals from the electromagnetic interference in the first battery cell may cancel out, partially or completely, the noise from the electromagnetic interference in the second battery cell.

In one example of the schematic of the current disclosure, the controller 102 may activate every other probe 122-1, 122-3 . . . to measure the battery cells 140-1 and 140-2 together, 140-3 and 140-4 together . . . . The controller 102 may measure the battery cells 140-1 and 140-2 (together) via the probes 122-1 and 122-3, the battery cells 140-3 and 140-4 (together) via the probes 122-3 and 122-5, etc. If the controller 102 detects any defect in any of the battery cell pairs, the controller 102 may transmit a signal indicating the presence of the defect and the battery pack 130 may be replaced.

In another example, the controller 102 may toggle the deactivation of the "even" probes and the "odd" probes. During the first measurement session, the controller 102 may deactivate the even probes 122-2, 122-4 . . . to measure the battery cells 140-1 and 14-2 (together), the battery cells 140-3 and 140-4 (together), etc. During the second measurement session, the controller 102 may activate the even probes and deactivate the odd probes 122-1, 122-3 . . . to measure the battery cells 140-2 and 140-3 (together), the battery cells 140-4 and 140-5 (together) . . . . As such, the controller 102 may use software and/or hardware to isolate any defective battery cell. Other combinations of measurements may also be implemented according to aspects of the present disclosure.

Figure 3:
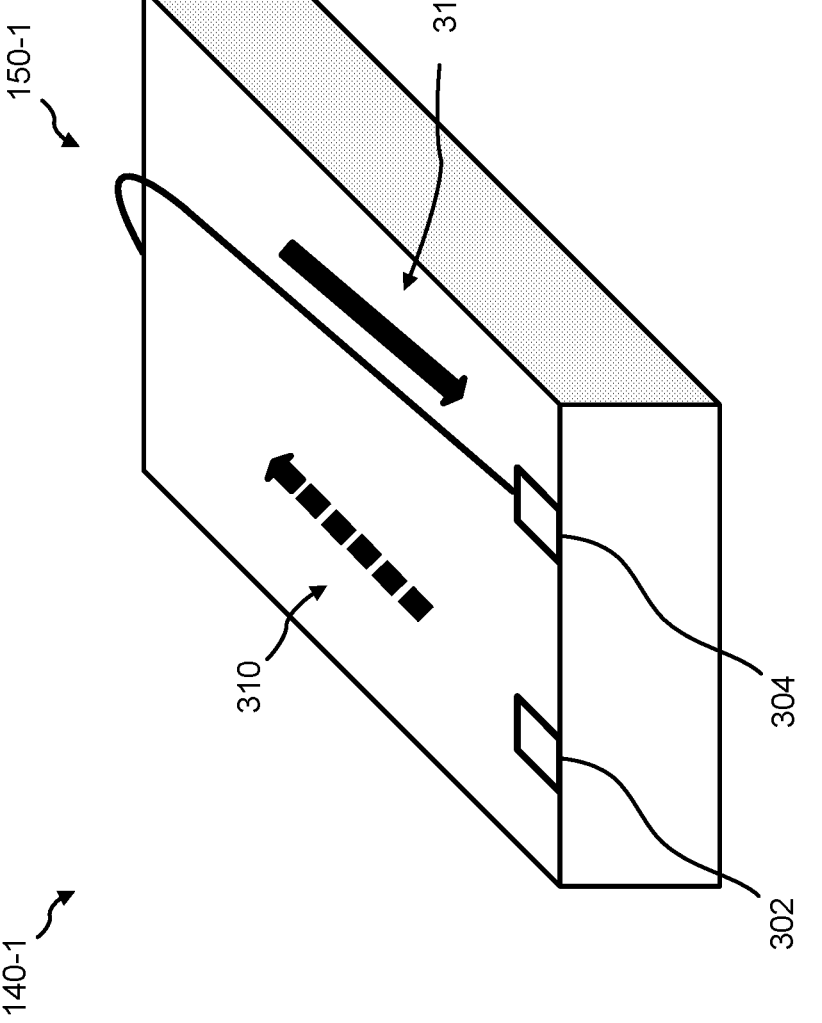
FIG. 3 illustrates an example of the wiring for a battery cell according to some aspects of the present disclosure.

FIG. 3 illustrates an example of the wiring of a battery cell. In an aspect of the present disclosure, and referring to FIGS. 1 and 2, FIG. 3 illustrates the battery 140-1 having the sense cable 150-1. Here, a single sense cable is shown for illustrative purpose. The battery 140-1 may include contact pads 302, 304 disposed on the same side of the battery 140-1. The contact pads 302, 304 may be electrically connected to the contact pins 124-1, 124-2, respectively.

In an aspect of the present disclosure, the sense cable 150-1 may be disposed across the battery 140-1 such that the one or more interrogatory currents $I_{Stim}$ flows through the battery 140-1 (or in a conduction channel of the battery 140-1) in a first direction 310 and in the sense cable 150-1 in a second direction 312. Consequently, the electromagnetic interference caused by the one or more interrogatory currents $I_{Stim}$ flowing in the first direction 310 may be reduced or cancelled by the one or more interrogatory currents $I_{Stim}$ flowing in the second direction 312.

Figure 4A:
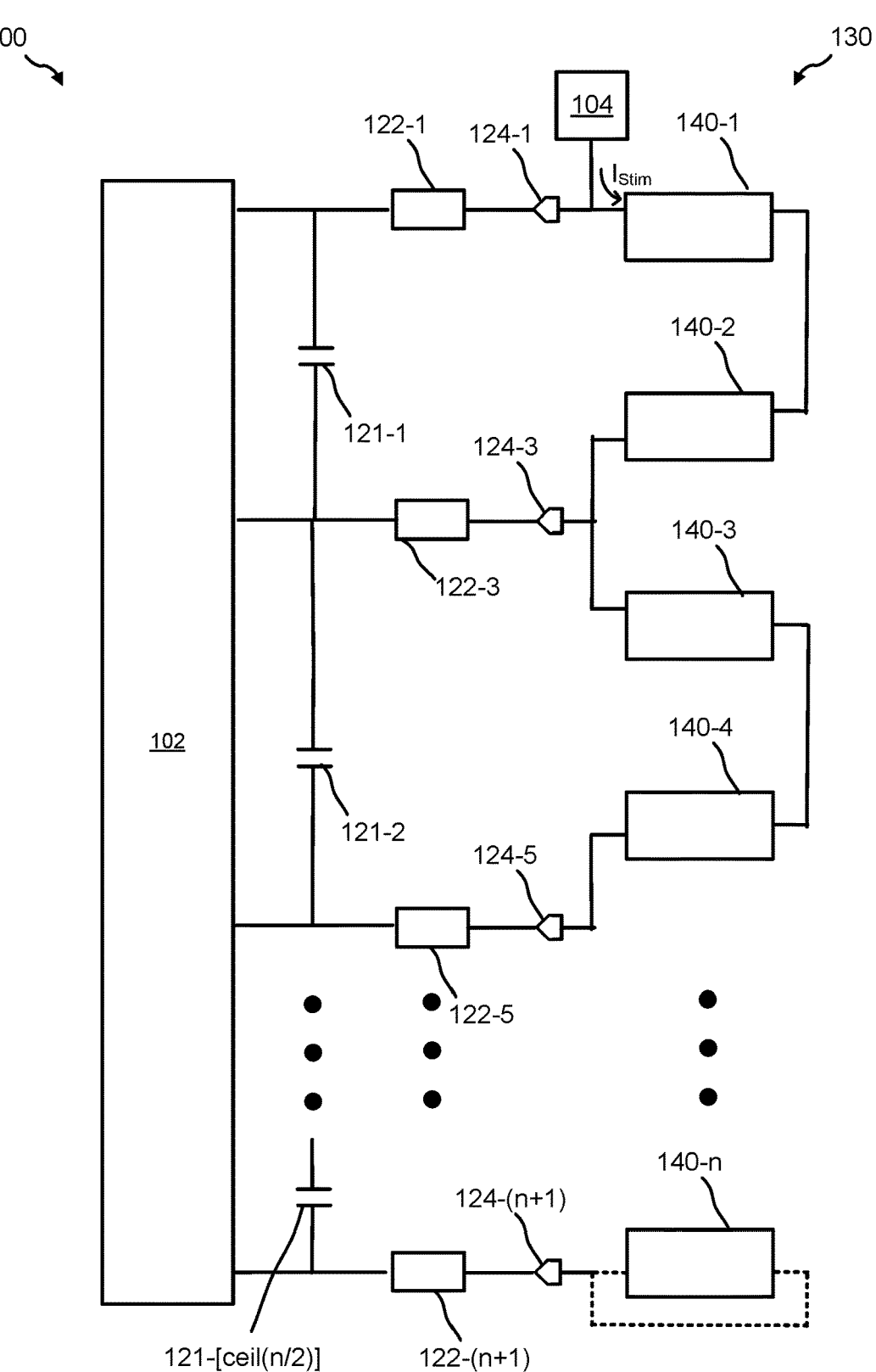
FIGS. 4A-B illustrate three examples of operating the system for measuring the impedance of battery cells according to some aspects of the present disclosure.
Figure 4B:
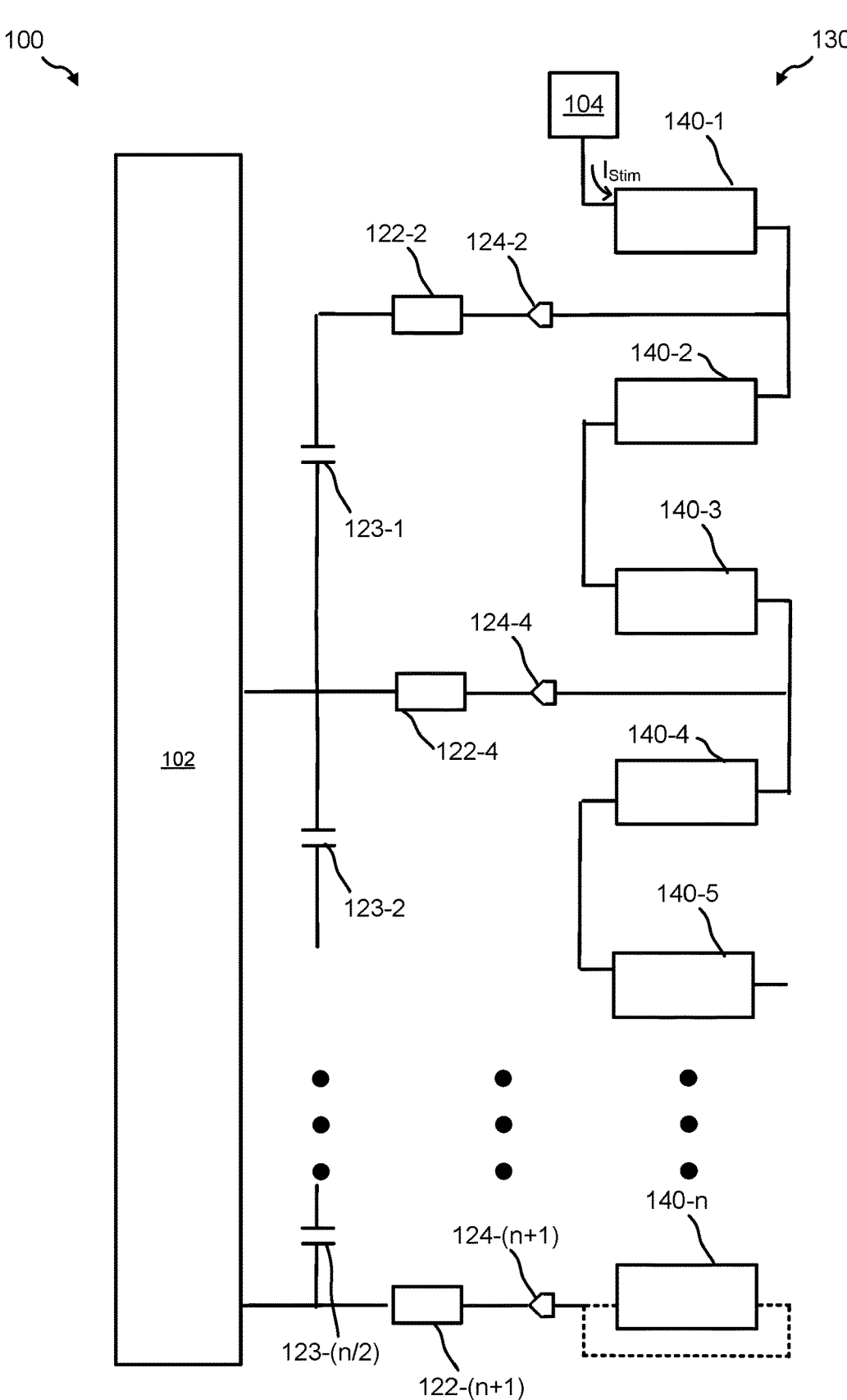

FIGS. 4A-B illustrate two examples of schematics for operating the system 100 shown in FIG. 1 and/or FIG. 4C below. Referring to FIGS. 1 and 4A, an aspect of the present disclosure includes measuring two battery cells at the same time. By measuring two battery cells at the same time, the electromagnetic interference from the one or more interrogatory currents $I_{Stim}$, high voltage lines, charging ports, operator interference, etc., may be identified, reduced, and/or eliminated. In one aspect, when measuring two battery cells at the same time, noise signals from the electromagnetic interference may appear identical on the impedance measurements of both battery cells. Consequently, the controller 102 may use software and/or hardware to remove the noise signals. In another aspect, when measuring two battery cells at the same time, the noise signals from the electromagnetic interference in the first battery cell may cancel out, partially or completely, the noise from the electromagnetic interference in the second battery cell.

In a first example of the schematic of the current disclosure shown in FIG. 4A, the controller 102 may activate every other "odd" probes 122-1, 122-3 . . . to measure the battery cells 140-1 and 140-2 together, 140-3 and 140-4 together . . . . The controller 102 may measure the battery cells 140-1 and 140-2 (together) via the probes 122-1 and 122-3, the battery cells 140-3 and 140-4 (together) via the probes 122-3 and 122-5, etc. Capacitors 121-1, 121-2 . . . 121-[ceil(n/2)] may be parasitic capacitors that result from the wires connecting the probes 122-1, 122-3 . . . to the controller 102, and/or non-parasitic capacitors.

In a second example of the schematic of the current disclosure shown in FIG. 4B, the controller 102 may activate every other "even" probes 122-2, 122-4 . . . to measure the battery cells 140-2 and 140-3 together, 140-4 and 140-5 together . . . . The controller 102 may measure the battery cells 140-2 and 140-3 (together) via the probes 122-2 and 122-4, the battery cells 140-4 and 140-5 (together) via the probes 122-4 and 122-6 (not shown), etc. Capacitors 123-1, 123-2 . . . 123-(n/2) may be parasitic capacitors that result from the wires connecting the probes 122-2, 122-4 . . . to the controller 102, and/or non-parasitic capacitors.

In some instances, if the controller 102 detects any defect in any of the battery cell pairs, the controller 102 may transmit a signal indicating the presence of the defect and the battery pack 130 may be replaced. As such, the controller 102 may use software and/or hardware to isolate any defective battery cell. Other combinations of measurements may also be implemented according to aspects of the present disclosure.

In the configurations of the system 100 shown in FIGS. 4A-B, the electromagnetic interference caused by the one or more interrogatory currents $I_{Stim}$ in the conduction channel of one battery may mitigate and/or cancel the electromagnetic interference caused by the one or more interrogatory currents $I_{Stim}$ in the conduction channel of the neighboring battery.

Figure 4C:
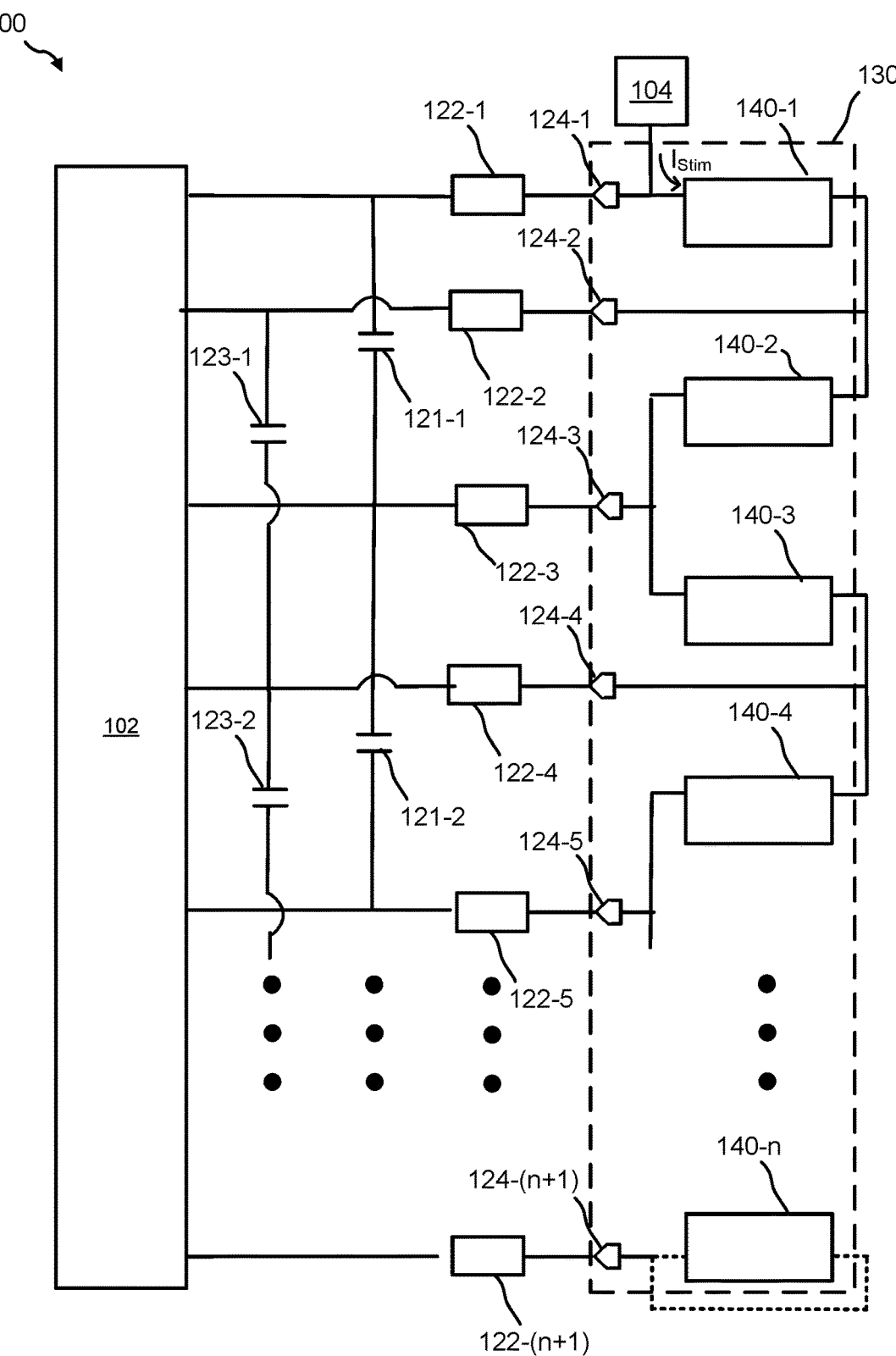
FIG. 4C illustrates an example of a system for measuring the impedance of battery cells according to some aspects of the present disclosure.

FIG. 4C illustrates an implementation of the impedance measurement system according to aspects of the present disclosure. Here, the battery cells 140-1, 140-2 . . . 140-$n$ may be connected in series. The contact pins 124-1, 124-2 . . . 124-$n$ may be connected to the same terminal of the respective battery cells 140-1, 140-2 . . . 140-$n$. For example, the contact pins 124-1, 124-2 . . . 124-$n$ may be connected to the negative terminals of the respective battery cells 140-1, 140-2 . . . 140-$n$, and the contact pin 124-$(n+1)$ may be connected to the positive terminal of the battery cell 140-$n$. In another example, the contact pins 124-1, 124-2 . . . 124-$n$ may be connected to the positive terminals of the respective battery cells 140-1, 140-2 . . . 140-$n$, and the contact pin 124-$(n+1)$ may be connected to the negative terminal of the battery cell 140-$n$. The configurations shown in FIG. 4C may allow for the measurements of two neighboring battery cells at once (as discussed above with respect to FIGS. 4A and 4B).

Figure 5:
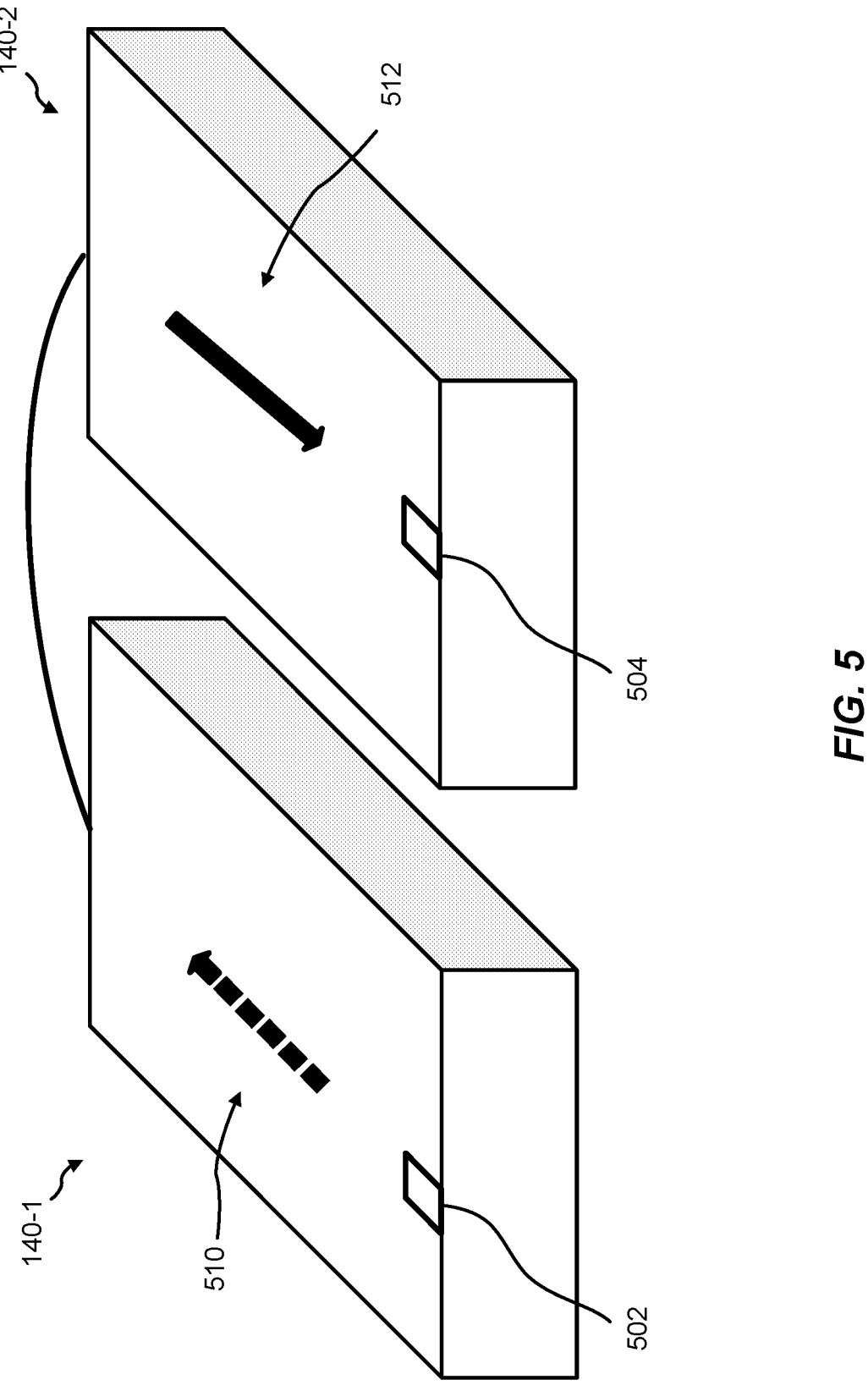
FIG. 5 illustrates an example of the placement of battery cells according to some aspects of the present disclosure.

FIG. 5 illustrates an example of the placement of battery cells. In an aspect of the present disclosure, and referring to FIGS. 1 and 4, FIG. 5 illustrates the battery 140-1 and the battery 140-2 interconnected via the sense cable 150-1.

Here, a single sense cable is shown for illustrative purpose. The battery 140-1 may include a contact pad 502 disposed on the side of the battery 140-1. The contact pad 502 may be electrically connected to the contact pin 124-1. The battery 140-2 may include a contact pad 504 disposed on the side of the battery 140-2. The contact pad 504 may be electrically connected to the contact pin 124-3.

In an aspect of the present disclosure, the sense cable 150-1 may be disposed between the battery 140-1 and the battery 140-2. The battery 140-1 and the battery 140-2 may be placed such that the one or more interrogatory currents $I_{Stim}$ flows through the battery 140-1 (or in a conduction channel of the battery 140-1) in a first direction 510 and through the battery 140-2 (or in a conduction channel of the battery 140-2) in a second direction 512. Consequently, the electromagnetic interference caused by the one or more interrogatory currents $I_{Stim}$ flowing in the first direction 510 may be reduced or cancelled by the one or more interrogatory currents $I_{Stim}$ flowing in the second direction 512.

Figure 6:
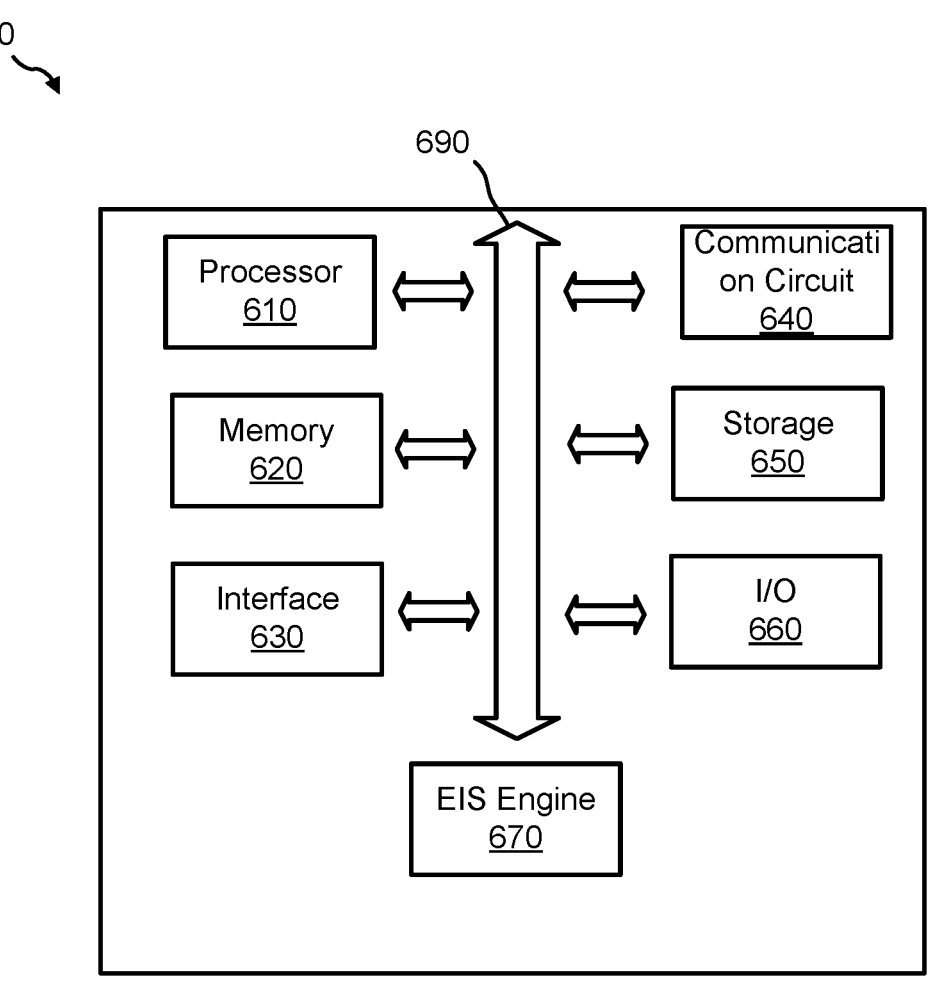
FIG. 6 illustrates an example of a controller according to some aspects of the present disclosure.

FIG. 6 illustrates an example of a controller 600 for a battery measurement system, such as the system 100. The controller 600 may include some or all of the functions of the controller 102 (FIG. 1). The controller 600 may be in a single package or as a chip set assembly with multiple components. The controller 600 may include a processor 610 configured to execute instructions stored in a memory 620. The memory 620 may include computer executable instructions. The controller 600 may include an interface circuit 630 configured to provide a hardware interface with external devices. The controller 600 may include a communication circuit 640 configured to communicate via wired or wireless communication channels. The controller 600 may include a storage 650 configured to store digital information. The controller 600 may include an input/output (I/O) interface device 660 configured to receive input signals and/or transmit output signals.

In some aspects of the present disclosure, the controller 600 may include an EIS engine 670 configured to perform EIS analysis, including the measurements of voltages and/or currents, and the calculation of impedances. The controller 600 may include a bus 690 configured to provide connections among the subcomponents of the controller 600. The controller 102 may be implemented as the controller 600, and/or include one or more subcomponents of the controller 600.

Aspects of the present disclosure include a battery measurement system having a plurality of capacitors, a plurality of probes each electrically coupled with a corresponding capacitor of the plurality of capacitors and a corresponding battery of a plurality of batteries, a controller configured to measure, via the plurality of probes, a plurality of voltages associated with the plurality of batteries in response to an interrogatory current, and a plurality of sense cables each associated with the corresponding battery of the plurality of batteries, wherein each sense cable of the plurality of sense cables is disposed across the corresponding battery such that the interrogatory current flows in a conduction channel in the corresponding battery in a first direction and in the corresponding cable in a second direction substantially opposite of the first direction.

Aspects of the present disclosure include the battery measurement system above, further comprises the plurality of batteries.

Aspects of the present disclosure include any of the battery measurement systems above, wherein each of the sense cable is disposed substantially parallel to the conduction channel in the corresponding battery such that at least a portion of a first magnetic field generated by the interrogatory current flowing in the conduction channel is cancelled by a second magnetic field generated by the interrogatory current flowing in the sense cable.

Aspects of the present disclosure include any of the battery measurement systems above, further comprising a current source configured to supply the interrogatory current through the plurality of batteries.

Aspects of the present disclosure include any of the battery measurement systems above, wherein the current source is further configured to sequentially supply an alternating current (AC) interrogatory current through each of the plurality of batteries.

Aspects of the present disclosure include any of the battery measurement systems above, wherein the controller is further configured to measure, via the plurality of probes, a plurality of AC voltages associated with the plurality of batteries in response to the AC interrogatory current.

Aspects of the present disclosure include any of the battery measurement systems above, wherein the AC interrogatory current has an interrogatory frequency between 0.5 hertz and 10 kilohertz.

Aspects of the present disclosure include any of the battery measurement systems above, wherein the plurality of batteries are connected in series.

Aspects of the present disclosure include any of the battery measurement systems above, further comprises a plurality of pins, wherein each pin of a subset of the plurality of pins is electrically coupled with two batteries of the plurality of batteries.

Aspects of the present disclosure include any of the battery measurement systems above, wherein the controller is further configured to contemporaneously measure a first voltage associated with a first battery of the plurality of batteries and a second voltage associated with a second battery of the plurality of batteries in response to the interrogatory current, wherein the first battery is electrically coupled with the second battery.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. For example, changes may be made in the function and arrangement of elements discussed without departing from the scope of the disclosure. Also, various examples may omit, substitute, or add various procedures or components as appropriate. For instance, the methods described may be performed in an order different from that described, and various steps may be added, omitted, or combined. Also, features described with respect to some examples may be combined in other examples. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above may be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that may be accessed by a general purpose or special purpose computer. By way of example, and not limitation, computer-readable media may comprise RAM, ROM, EEPROM, CD-ROM or other optical disk storage, magnetic disk storage or other magnetic storage devices, or any other medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:
1. A battery measurement system, comprising:
a plurality of capacitors;
a plurality of probes each electrically coupled with:
   a corresponding capacitor of the plurality of capacitors; and
   a corresponding battery of a plurality of batteries;
a controller configured to:
   provide an interrogatory current; and
   measure, via the plurality of probes and the plurality of capacitors, a plurality of voltages associated with the plurality of batteries in response to the interrogatory current; and a plurality of sense cables each associated with the corresponding battery of the plurality of batteries, wherein each sense cable of the plurality of sense cables is disposed across the corresponding battery such that the interrogatory current flows in a conduction channel in the corresponding battery in a first direction and in the corresponding cable in a second direction substantially opposite of the first direction, and wherein a first end of each sense cable is disposed at a first end of the corresponding battery and a second end of each sense cable is disposed at a second end of the corresponding battery that is opposite to the first end of the corresponding battery.

2. The battery measurement system of claim 1, further comprising the plurality of batteries.

3. The battery measurement system of claim 1, wherein each of the sense cable is disposed substantially parallel to the conduction channel in the corresponding battery such that at least a portion of a first magnetic field generated by the interrogatory current flowing in the conduction channel is cancelled by a second magnetic field generated by the interrogatory current flowing in the sense cable.

4. The battery measurement system of claim 1, further comprising a current source configured to supply the interrogatory current through the plurality of batteries.

5. The battery measurement system of claim 4, wherein the current source is further configured to sequentially supply an alternating current (AC) interrogatory current through each of the plurality of batteries.

6. The battery measurement system of claim 5, wherein the controller is further configured to measure, via the plurality of probes, a plurality of AC voltages associated with the plurality of batteries in response to the AC interrogatory current.

7. The battery measurement system of claim 5, wherein the AC interrogatory current has an interrogatory frequency between 0.5 hertz and 10 kilohertz.

8. The battery measurement system of claim 1, wherein batteries of the plurality of batteries are connected in series.

9. The battery measurement system of claim 1, further comprising a plurality of pins, wherein each pin of a subset of the plurality of pins is electrically coupled with two batteries of the plurality of batteries.

10. The battery measurement system of claim 1, wherein the controller is further configured to contemporaneously measure a first voltage associated with a first battery of the plurality of batteries and a second voltage associated with a second battery of the plurality of batteries in response to the interrogatory current, wherein the first battery is electrically coupled with the second battery.

11. A battery measurement system, comprising:
a plurality of capacitors;
a plurality of probes each electrically coupled with:
a corresponding capacitor of the plurality of capacitors; and
a corresponding battery of a plurality of batteries;
a controller configured to:
provide an interrogatory current; and
measure, via the plurality of probes and the plurality of capacitors, a plurality of voltages associated with the plurality of batteries in response to the interrogatory current; and
a plurality of sense cables each associated with the corresponding battery of the plurality of batteries, wherein:
each sense cable of the plurality of sense cables is disposed across the corresponding battery such that the interrogatory current flows in a conduction channel in the corresponding battery in a first direction and in the corresponding cable in a second direction substantially opposite of the first direction, and
each of the sense cable is disposed substantially parallel to the conduction channel in the corresponding battery such that at least a portion of a first magnetic field generated by the interrogatory current flowing in the conduction channel is cancelled by a second magnetic field generated by the interrogatory current flowing in the sense cable.

12. The battery measurement system of claim 11, further comprising a current source configured to supply the interrogatory current through the plurality of batteries.

13. The battery measurement system of claim 12, wherein the current source is further configured to sequentially supply an alternating current (AC) interrogatory current through each of the plurality of batteries.

14. The battery measurement system of claim 13, wherein the controller is further configured to measure, via the plurality of probes, a plurality of AC voltages associated with the plurality of batteries in response to the AC interrogatory current.

15. The battery measurement system of claim 13, wherein the AC interrogatory current has an interrogatory frequency between 0.5 hertz and 10 kilohertz.

16. The battery measurement system of claim 11, wherein batteries of the plurality of batteries are connected in series.

17. The battery measurement system of claim 11, further comprising a plurality of pins, wherein each pin of a subset of the plurality of pins is electrically coupled with two batteries of the plurality of batteries.

18. The battery measurement system of claim 11, wherein the controller is further configured to contemporaneously measure a first voltage associated with a first battery of the plurality of batteries and a second voltage associated with a second battery of the plurality of batteries in response to the interrogatory current, wherein the first battery is electrically coupled with the second battery.

* * * * *